United States Patent

Rees

[11] Patent Number: 5,828,262
[45] Date of Patent: Oct. 27, 1998

[54] ULTRA LOW POWER PUMPED N-CHANNEL OUTPUT BUFFER WITH SELF-BOOTSTRAP

[75] Inventor: David B. Rees, Overton, United Kingdom

[73] Assignee: Cypress Semiconductor Corp., San Jose, Calif.

[21] Appl. No.: 723,077

[22] Filed: Sep. 30, 1996

[51] Int. Cl.$^6$ ................................................. H03K 17/16
[52] U.S. Cl. ........................... 327/390; 327/434; 327/589
[58] Field of Search .................................. 327/390, 589, 327/536, 537, 434

[56] References Cited

U.S. PATENT DOCUMENTS

| | | | |
|---|---|---|---|
| 4,042,838 | 8/1977 | Street et al. | 207/270 |
| 4,219,743 | 8/1980 | Millns et al. | 307/270 |
| 4,484,092 | 11/1984 | Campbell, Jr. | 307/578 |
| 4,503,343 | 3/1985 | Ohuchi | 307/482 |
| 4,540,898 | 9/1985 | Pumo et al. | 307/269 |
| 4,574,273 | 3/1986 | Atsumi et al. | 327/589 |
| 4,612,462 | 9/1986 | Asano et al. | 307/482 |
| 4,725,746 | 2/1988 | Segawa et al. | 307/482 |
| 5,216,290 | 6/1993 | Childers | 307/296.1 |
| 5,241,502 | 8/1993 | Lee et al. | 365/203 |
| 5,270,588 | 12/1993 | Choi | 307/475 |
| 5,281,869 | 1/1994 | Lundberg | 307/443 |
| 5,381,061 | 1/1995 | Davis | 326/57 |
| 5,399,920 | 3/1995 | Van Tran | 326/83 |
| 5,656,571 | 8/1997 | Ohashi | 327/390 |

FOREIGN PATENT DOCUMENTS

| | | |
|---|---|---|
| 0045133 | 2/1982 | European Pat. Off. . |
| 0046498 | 3/1982 | European Pat. Off. . |
| 00129661 | 1/1985 | European Pat. Off. . |
| 52-35570A | 3/1977 | Japan . |
| 53-125753A | 11/1978 | Japan . |
| 59-16424A | 1/1984 | Japan . |

OTHER PUBLICATIONS

"MOSFET Powering Circuit", Sonoda, G., IBM Technical Disclosure Bulletin, vol. 13, No. 9, pp. 2658, Feb. 1971.
"Bootstrap Inverter Driver," Harroun, V.T., IBM Technical Disclosure Bulletin, vol. 19, No. 3, pp. 827–28, Aug. 1976.
"Bufferized ECL–Type Logic Circuit," IBM Technical Disclosure Bulletin, vol. 33, No. 4, pp. 343–344, Sep. 1990.

*Primary Examiner*—Timothy P. Callahan
*Assistant Examiner*—Jung Ho Kim
*Attorney, Agent, or Firm*—Maiorana & Acosta, P.C.

[57] ABSTRACT

An ultra-low power pumped n-channel transistor output buffer with self-bootstrapping includes an n-channel pullup transistor as the primary pullup device. A gate-to-source capacitance $C_{gs}$ of the pullup transistor is used to self-bootstrap the input data signal. A pass n-channel transistor is connected between the input data signal, and the gate of the pullup transistor, and is biased on a gate terminal thereof by a charge pump having a voltage magnitude one device threshold higher than the device operating rail $V_{cc}$. The pass transistor, so biased, permits the input data signal, which may have a magnitude of $V_{cc}$, to charge $C_{gs}$. An over-voltage can be developed on the gate of the pullup transistor by the self-bootstrapping effect of $C_{gs}$. The pass transistor, in addition, so biased, prevents such over-voltage on the pullup transistors gate from being shorted to $V_{cc}$ through a driving device. The output buffer also includes a p-channel transistor having source and drain terminals defining a channel that is connected between another pumped voltage rail, and the gate of the pullup transistor. This p-channel transistor is activated when the output on the pad is desired to be a logic one, and operates to replenish any charge lost on the bootstrap capacitance due to leakage on the gate of the pullup transistor, or from leakage on the drain of the pass transistor. A second capacitor, similar in size to the pass transistor capacitance, is connected between the gate of the pass transistor, and the gate of a pulldown n-channel transistor, and operates to equalize and reduce the effect of transition changes in the input data signal.

21 Claims, 3 Drawing Sheets the pad must be driven to the full positive power supply voltage $V_{cc}$. Otherwise, a reduced-swing output at 3.3 volt operating rail would provide too low of an output (e.g., 1.5 to 2.0 volts).

ULTRA LOW POWER PUMPED N-CHANNEL OUTPUT BUFFER WITH SELF-BOOTSTRAP

INCORPORATION BY REFERENCE

This application is related to copending application entitled "Bootstrap Augmentation Circuit and Method", Attorney Docket No. 64,663-038 (CD96023), which is commonly owned, filed simultaneously herewith and hereby incorporated by reference.

BACKGROUND OF THE INVENTION

1. Field of the Invention

The present invention relates generally to output buffers of the type employed to control the voltage on an output pad of a semiconductor device, and, more particularly, to an ultra low power pumped n-channel transistor output buffer having self-bootstrap capability.

2. Description of the Related Art

There has been much research related to the design and operation of semiconductor devices. In particular, such research has focused on providing designs that optimize power consumption, operating speed, circuit size, and operating voltage flexibility. With respect to an output buffer, the above-mentioned flexibility requirement means that such an output buffer design should be fairly easy to convert to operate with different power supplies (e.g., with a 5 volt power supply, as well as a 3.3 volt power supply). One technique for achieving this flexibility in design is to use an n-channel field effect transistor as the pullup device. For example, it is known to use the n-channel transistor in a 5 volt device in order to provide a reduced-swing logic high output voltage ($V_{OH}$), and, alternatively, to provide a full-rail swing when the power supply is 3.3 volts (or equivalents thereof). One of ordinary skill in the art will recognize that to provide such a high output signal ($V_{OH}$) meeting commonly recognized operating requirements, when using a 3.3 volt power supply, the pad must be driven to the full positive power supply voltage $V_{cc}$. Otherwise, a reduced-swing output at 3.3 volt operating rail would provide too low of an output (e.g., 1.5 to 2.0 volts).

It should be further recognized (as the source of the above problem) that when the drain terminal of the n-channel transistor is tied to Vcc, and the gate terminal is then driven with a drive signal also equal to $V_{cc}$, that the source terminal, which is connected to the output pad, can be driven only to one device threshold $V_{TH}$ less than $V_{cc}$. A conventional technique for overcoming this problem is to provide a gate drive signal that is more than a device threshold above the operating voltage $V_{cc}$. Known ways for implementing this approach include switching an output terminal of a charge pump, which produces just such a voltage greater than $V_{cc}$, to the gate of the pullup n-channel transistor, or, using a bootstrap capacitor in connection with a drive signal having a magnitude of $V_{cc}$ from a driver device.

While perhaps providing design flexibility, the above-mentioned approaches for providing a "boosted" drive signal have a basic failing insofar as they do not satisfactorily provide for low power consumption. In particular, these conventional approaches are dynamic in nature, wherein the "boosted" voltage is permitted to decay over time due to leakages in the circuit or with signal transitions. For example, with respect to the bootstrapping method, a capacitance (e.g., the gate to drain capacitance of a transistor) is initially charged to $V_{cc}$ by the drive signal, and, subsequently, such voltage across the capacitance is additively coupled to the input signal as the output voltage rises to obtain the "boosted" gate drive. The driver generating this drive signal (having a magnitude of $V_{cc}$) is commonly implemented using a p-channel transistor. Loss of charge can occur when the above-$V_{cc}$ voltage is subsequently shorted to $V_{cc}$ through this p-channel transistor of the driver device unless some isolating means is used. The charge will definitely be lost when the driver signal is taken to $V_{ss}$ for the opposite transition of the output signal. This approach not only consumes relatively large amounts of power, but, moreover, cannot be operated below a predetermined frequency. This frequency limitation occurs when the gate drive voltage falls, due to the charge leakages in the circuit, to less than one device threshold above $V_{cc}$ (due to this discharge), wherein the pullup n-channel transistor can no longer provide the full-rail swing (as required) on the output pad.

Accordingly, there is a need to provide an output buffer of the type suitable for driving an output pad of a semiconductor device that reduces or eliminates one or more of the problems as described above, and in particular the problem of excessive power consumption.

SUMMARY OF THE INVENTION

It is an object of the present invention to provide an output buffer having ultra-low power consumption, one that occupies a relatively small area on a semiconductor die, one that provides adequate operating speed, and, additionally is easily converted to operate between various power supply voltages, such as between a 5 volt power supply, and a 3.3 volt power supply. The inventive output buffer achieves these and other objects by avoiding the use of an over-voltage or "boosted" power source (e.g., charge pump) to power the gate of dynamically switching transistors in the output buffer itself; that is, such power source may be used only to counteract leakage currents in the circuit.

An output buffer in accordance with the invention is responsive to an input signal from a driver for generating an output signal on a pad connected thereto, and includes a pullup n-channel transistor, and an n-channel pass transistor. The pullup transistor has a drain terminal connected to a positive bus of a first power supply producing a first voltage level (preferably $V_{cc}$), and a source terminal connected to the pad. The gate-to-source overlap capacitance $C_{gs}$ of the pullup transistor defines a bootstrap capacitor used to bootstrap the input data signal supplied to the gate of the pullup transistor. The pass transistor has a drain terminal connected to the gate terminal of the pullup transistor, and a source terminal responsive to the input signal (from the driver). The gate terminal of the pass transistor is connected to a second power supply producing a second voltage level. The second voltage level is about one device threshold higher than the first voltage ($V_{cc}$). The relative magnitudes described above permit the pass transistor to pass the input signal from the driver to the pullup transistor's gate to charge the bootstrap capacitor during an initial phase. As the pullup transistor is made conductive, and the output pad voltage rises, the voltage level on the gate of the pullup transistor is "boosted" due to this preexisting charge on the bootstrap capacitor. The pass transistor, so biased, prevents voltage levels higher than $V_{cc}$ on the pullup transistor's gate from falling due to charge leakage to the driver, thus conserving charge, and lowering power consumption. Moreover, since the pass transistor is always "ON" the current drawn from a charge pump that is supplying the pass transistor's gate drive signal is significantly reduced, since it is not drawn dynamically according to input signal transitions. Further, use of n-channel technology makes conversion between 3.3 volt and 5 volt systems fairly easy (as described above).

In a preferred embodiment, the buffer further includes a p-channel transistor connected between the gate of the n-channel pullup transistor, and a third power supply producing a third voltage level. This p-channel transistor is selectively controlled according to an inverted version of the input signal to form a highly resistive path. The highly resistive path is provided for replacing charge on the bootstrap capacitor/gate terminal of the pullup transistor that is lost due to leakage via the gate of the pullup transistor, and via the drain of the pass transistor. Further, in this preferred embodiment, the output buffer further includes a capacitor coupled between the gate terminal of the pass transistor, and the gate terminal of an n-channel pulldown transistor. Since the gate signals applied to the pullup transistor, and pulldown transistor are complementary (except for the case where the output buffer is to be tri-stated), the coupling across this added capacitor is always equal in magnitude, but opposite in polarity, compared to the coupling between the capacitance associated with the pass transistor (i.e., the source-to-gate capacitance). This feature prevents erratic conduction patterns of the pass transistor by keeping the gate voltage of the pass transistor relatively constant.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENTS

Figure 1:
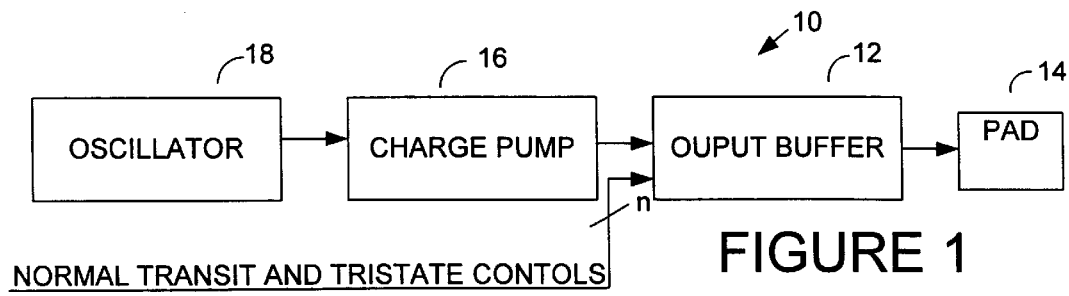
FIG. 1 is a simplified, block diagram view of a portion of a semiconductor device including a preferred embodiment of the inventive output buffer.

Referring now to the drawings wherein like reference numerals are used to identify identical components in the various views, FIG. 1 shows a portion of the semiconductor device 10 fabricated in accordance with the present invention. Device 10 includes an output buffer 12 according to the present invention, which is adapted to be connected to a corresponding pad 14. It should be appreciated that in a commercial device 10, it may be desirable to have a plurality of such output buffers, connected to a corresponding plurality of pads $14_i$.

Output buffer 12, the details of which appear hereinafter, provides the general function of responding to an input data signal from a function block (not shown), and, responds accordingly to generate an output signal on pad 14 connected thereto. Output buffer 12, as is well-known, may drive the voltage level on pad 14 to a predetermined voltage level for a logic high state ($V_{OH}$), and may source a predetermined current level in such a high logic state ($I_{OH}$). Alternatively, output buffer 12 may also perform the function of pulling the voltage level on the pad 14 to a logic low state, and sink a predetermined maximum current in such logic low state. Output buffer 12 may also be controlled to a high-impedance state (i.e., "tri-stated"). These basic functions of buffer 12 are well understood, and need no further elaboration.

Pad 14 is provided for connecting the output signal appearing thereon to a corresponding conductor (e.g., pin) disposed in a semiconductor package to interface with signals external to the semiconductor device (e.g., such as a bus or backplane).

Charge pump 16 is provided for supplying, on one or more output lines thereof, a corresponding number of output voltages that are each higher than the device operating voltage $V_{cc}$. Charge pump 16 may employ the use of oscillator 18, as is conventional and well-known, in order to generate such voltage levels. Charge pump 16 may take any one of a number of known forms for purposes of the present invention. Accordingly, no specific structure for performing the function of charge pump 16 is described herein nor believed necessary.

Figure 2:
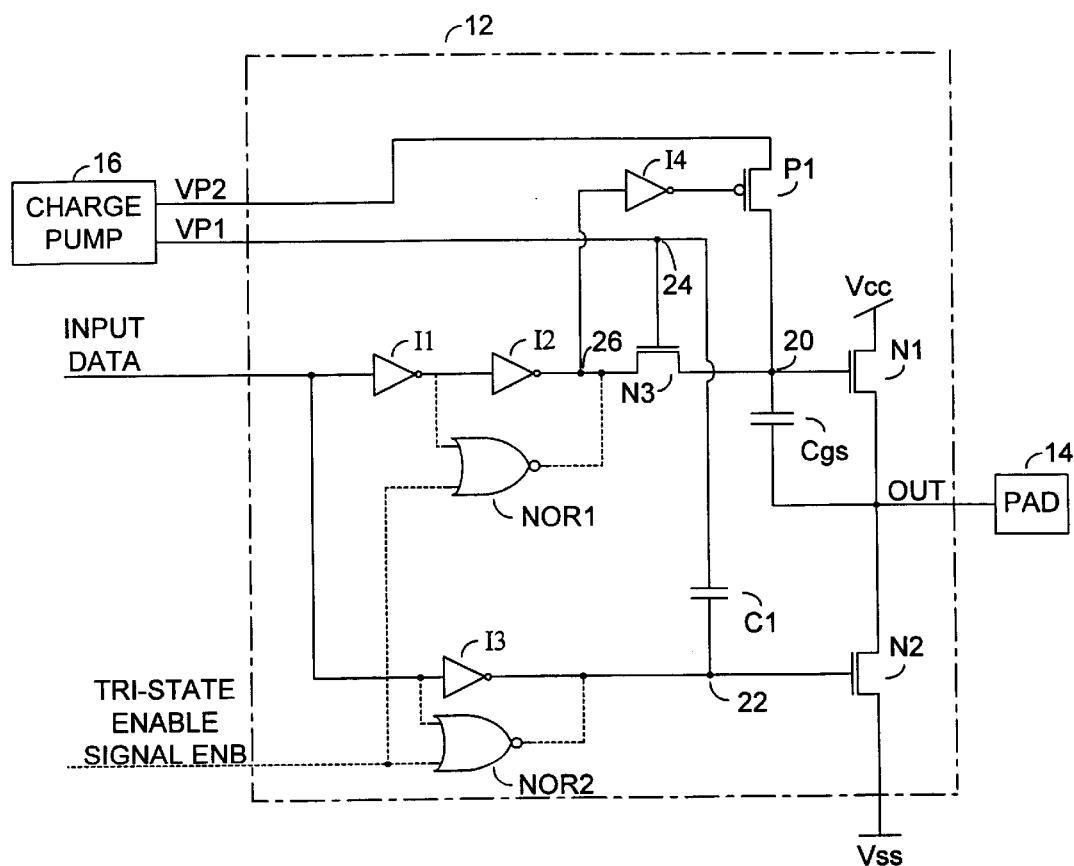
FIG. 2 is a simplified, schematic and block diagram view showing, in greater detail, the inventive output buffer illustrated in block diagram form in FIG. 1.

FIG. 2 shows, in greater detail, output buffer 12 and the plurality of outputs of charge pump 16. In particular, FIG. 2 shows a preferred embodiment of an output buffer 12 according to the present invention. Output buffer 12 includes means, such as n-channel field effect transistor N1, for selectively pulling a voltage level of pad 14 to a logic high state, means, such as n-channel field effect transistor N2, for pulling pad 14 to a logic low state, means, such as n-channel transistor N3, for passing the input data signal to transistor N1, bootstrap capacitor $C_{gs}$ formed by a gate-to-source overlap capacitance of transistor N1, a second capacitor C1, means, such as p-channel transistor P1, for replacing charge on $C_{gs}$, and inverters I1, I2, I3, and I4. In an alternate embodiment, NOR gate NOR1 replaces inverter I2, while NOR gate NOR2 replaces inverter I3. In this alternative embodiment, the NOR gates are responsive to a tri-state enable signal ENB for providing tri-state control of output buffer 12.

Transistor N1 performs the function of pulling pad 14 to a logic one or high state (which preferably assumes a voltage potential substantially equal to the device operating voltage $V_{cc}$). Transistor N1 includes a drain terminal connected to $V_{cc}$, and a source terminal connected to the output node (indicated at OUT), which is in turn connected to output pad 14. The transistor N1 may be a multi-finger device for providing an increased, aggregate channel width for meeting output current ($I_{OH}$) requirements. In the preferred embodiment, the positive power supply bus $V_{cc}$ produces a predetermined voltage level of approximately 3.3 volts. The conduction of transistor N1 is controlled by a bias voltage on a gate terminal 20 thereof in a manner generally known, and to be described in detail hereinafter.

The gate-to-source overlap capacitance of transistor N1 is used in the present invention to self-bootstrap the input data signal used to drive the gate of transistor N1. It should be appreciated, however, that capacitor $C_{gs}$ is not a distinct structure in device 10, but rather, is shown schematically simply to allow reference to this structural component of transistor N1.

Transistor N2 is connected between the output node/pad 14, and a negative power supply bus $V_{ss}$, which may be at a ground potential. The pulldown transistor N2 is responsive to an inverted version of the input data signal for performing the function of pulling pad 14 to a logic zero or low state. In this logic low state, pad 14 may be at a voltage substantially equivalent to $V_{ss}$. Pulldown device N2 is conventional, and well-known in the art. For example, transistor N2 may also be a multi-finger device for increasing the current sinking capability thereof.

Pass transistor N3 has a drain terminal that is connected to the gate node 20 of transistor N1 and, further, has a source terminal that is connected to the output of inverter I2 (or NOR-gate NOR1 in the alternative embodiment mentioned above) at node 26. Transistor N3 further includes a gate terminal, indicated at 24, which is connected to a first pumped voltage rail VP1 provided by charge pump 16. In the preferred embodiment, VP1 assumes a voltage potential of approximately one device threshold higher than the device operating voltage so that VP1 is substantially equal to $V_{cc}+V_{tn}$. Transistor N3 performs one function of allowing the input data signal, which may have a magnitude of approximately $V_{cc}$, to pass between its source, and drain terminals to thereby charge the bootstrap capacitance $C_{gs}$ associated with transistor N1. A second function performed by transistor N3 is that of preventing voltages developed on node 20, which are higher than $V_{cc}$, from decaying because of leakage through N3 (between source and drain terminals thereof) and subsequently through the output drive (e.g., p-channel device connected to $V_{cc}$) of inverter I2. Since the gate terminal 24 of N3 is biased to approximately one device threshold voltage higher than $V_{cc}$, any voltage appearing on gate 20 of N1, which is higher than $V_{cc}$, will cause transistor N3 to shut OFF. This action saves the buildup of charge on gate 20 of N1, thus reducing power consumption. It should be further appreciated that transistor N3, whose gate is connected to charge pump 16, is always biased ON, and is not required to switch according to desired output transitions as determined by transitions in the input data signal. This feature provides for low power consumption as well.

Inverters I1, I2, and I3 are used to buffer the input data signal such that the respective gate driving signals appearing on nodes 20, and 22, respectively, are complementary. It should be understood that the inverting buffers described above are illustrated in a simplified form. In an alternate embodiment, as mentioned above, the output generated by output buffer 12 may be required to assume a high-impedance (tri-state) state. A simplified structure for implementing tri-state control is shown by the two NOR gates NOR1, and NOR2. It should be understood by one of ordinary skill in the art that when the tri-state signal ENB is driven to a logic one, each of the two NOR gates NOR1, and NOR2 generate a logic zero signal, thus disabling both transistors N1, and N2 (i.e., th so-called high-impedance state). On the other hand, when the tri-state enable signal ENB is driven to a logic zero, NOR gates NOR1, and NOR2 are respectively conditioned to operate as inverters, generating an output based upon the input signal appearing on the other one of its two terminals.

Capacitor C1 is provided for equalizing and cancelling the effects of transitions on node 26 with respect to voltage level variations on node 24. In particular, it is possible, without capacitor C1, that when voltage transitions occur at the output of I2 at node 26, that such transitions would be coupled through the source-gate capacitance to the gate terminal of transistor N3, which may possibly adversely effect the required conduction state and hence function of transistor N3 in this application. Capacitor C1, which may be a transistor of similar size to transistor N3, is connected between node 24, and node 22. The coupling between node 26, and node 24, is always matched, in an opposite sense, by the coupling between node 22, and node 24, because the signals on nodes 26, and 22 are always complementary (i.e., are in anti-phase, except for the tri-state condition).

Transistor P1 is provided for replacing any charge lost by the bootstrap capacitance $C_{gs}$ over relatively long periods of time. In particular, over such periods of time, the charge on node 20 may decay due to leakage via the gate of transistor N1, and further via the drain of transistor N3. To prevent such leakage from adversely effecting the drive voltage on node 20, and when the output on pad 14 is required to be a logic high, transistor P1 is switched ON by way of inverting buffer I4. Buffer I4 is shown for the purpose of understanding circuit operation only. In an actual, commercial integrated circuit, this function may be performed by a relatively more complex arrangement of transistors. Transistor P1, by design, is relatively "weak" (i.e., has the capacity to pass only a relatively small amount of current therethrough) and therefore is preferably designed to do no more than replace the charge leaking from node 20. Transistor P1 performs its function by, essentially, forming a highly-resistive path to a second pumped voltage rail VP2. The magnitude of VP2 is selected so as to maintain the gate terminal of transistor N1 at a predetermined level (i.e., combat mere leakage currents). The predetermined level is selected so as to place N1 in a state of conduction that is sufficient to meet predetermined current sourcing levels ($I_{OH}$), while maintaining predetermined output voltage levels $V_{OH}$.

Before proceeding to a description of the operation, a summary of the theory and control established by the invention will be set forth. It shall be understood that since pullup transistor N1 is an n-channel device, it cannot usually pull the voltage on pad 14, and output signal OUT all the way to $V_{cc}$, because N1 will turn OFF when the output signal OUT reaches a level which causes the gate-to-source voltage $V_{gs}$ to fall below the transistor threshold voltage $V_{tn}$ (which may be modified by the back body effect). It is conventional to use this effect, when $V_{cc}$ equals approximately 5 volts, to produce a reduced swing on the output node, since the node never goes to $V_{cc}$.

However, when $V_{cc}$ is approximately 3.3 volts, a similar effect, if permitted, would be undesirable, since the magnitude of the output signal would never go much higher than 1.5 volts to 2.0 volts, which is, in many cases, too low. Thus, in accordance with the present invention, to increase the magnitude of the output signal $V_{OH}$, the voltage applied to the gate node 20 of transistor N1 must be substantially higher than the on-chip $V_{cc}$. In particular, in the embodiment illustrated in FIG. 2, such over-voltage is accomplished by bootstrapping the input data signal using $C_{gs}$.

The description set forth immediately below assumes that the output pad has a pre-existing voltage thereon that is approximately equal to zero volts. When a nonzero voltage appears on the pad, a potential problem may arise wherein the self-bootstrapping may not occur, or may not occur to the level desired. This particular problem has been solved, and is described and claimed in my copending application entitled "Bootstrap Augmentation Circuit and Method", referred to above under Incorporation by Reference.

Figure 3:
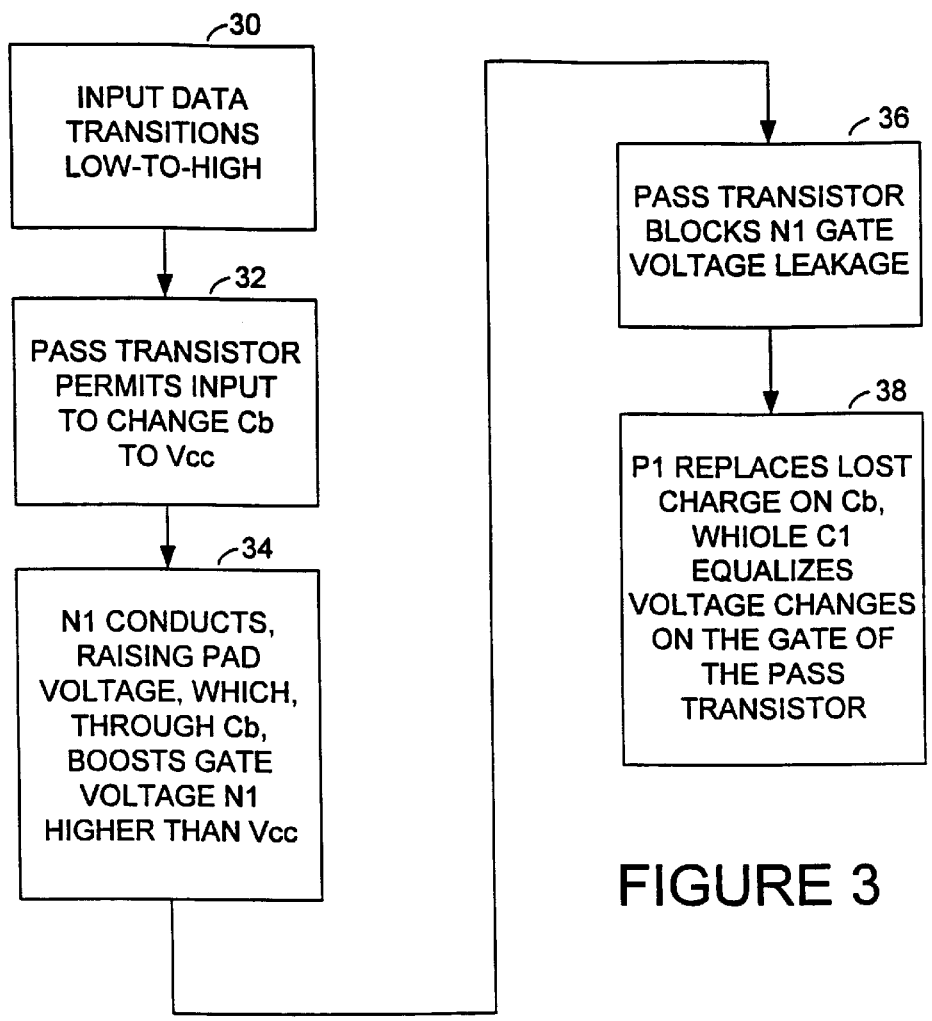
FIG. 3 is a simplified, flow chart diagram illustrating the steps involved in the operation of an output buffer according to the present invention.
Figure 4:
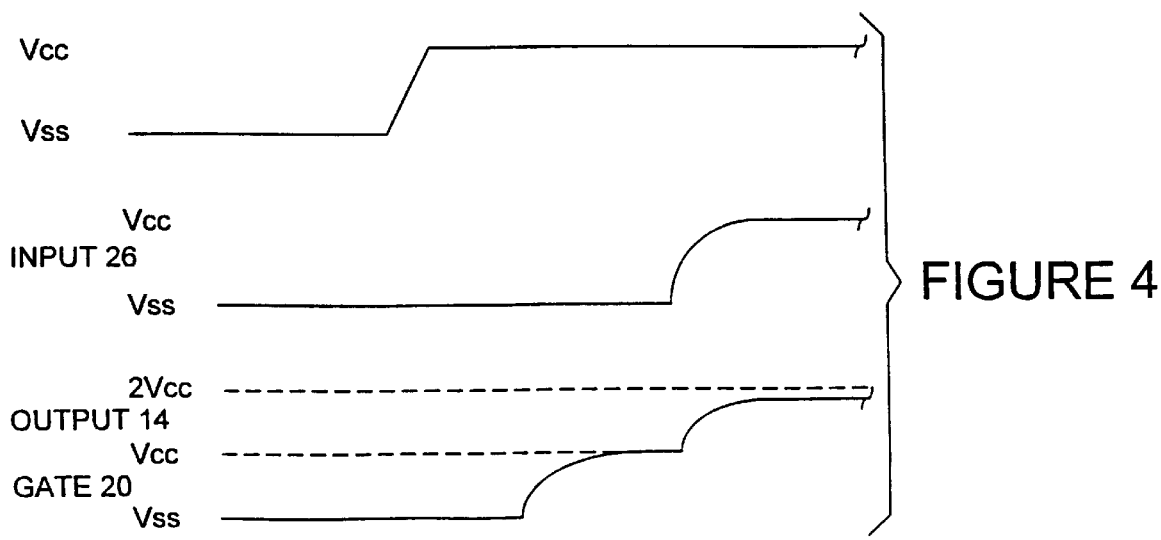
FIG. 4 is a simplified, timing diagram view illustrating various signals at various nodes during the operation of the embodiment of FIG. 2.

Referring now to FIGS. 2, 3 and 4, a detailed description of the operation of an embodiment of the invention will be set forth. In step 30, of FIG. 3, assume that the input data is initially at a logic low state. Subsequently, the input data transitions low-to-high. This is shown in FIG. 4.

In step 32, after the input data signal has propagated through inverters I1, and I2, the input data signal, which may have a magnitude of approximately $V_{cc}$, is permitted to pass between source and drain of transistor N3, since the gate terminal 24 of N3 is biased to a level about one device threshold higher than $V_{cc}$. Assuming that the output node is initially at a logic low state (i.e., approximately 0 volts), then the gate-to-source overlap capacitance $C_{gs}$ is charged thereby to approximately $V_{cc}$ across its terminals (i.e., between node 20, and the output node OUT). This charging is shown in the bottom trace of FIG. 4.

In step 34, pullup transistor N1 begins to conduct, thus raising the output pad voltage. As the voltage on the output node begins to rise, it "pushes" the voltage on the gate terminal N1 upwards because of the pre-existing voltage on $C_{gs}$. The level on node 20 will thus be raised above $V_{cc}$, (shown in the middle trace of FIG. 4), thereby turning transistor N1 on harder, which will cause the voltage on the output node OUT to rise even faster. The limit is reached when the voltage on the output node OUT reaches $V_{cc}$, since it cannot go any higher as the drain terminal of N1 is tied to $V_{cc}$.

In step 36, transistor N3 blocks the "boosted" voltage on node 20 from leaking. In particular, the gate of N3 is a device threshold $V_{tn}$ above $V_{cc}$, as generated by pumped rail VP1. Under these conditions, transistor N3 will pass voltage up to $V_{cc}$ directly between its source and/or drain. If either one of the source or drain terminals of N3 is pushed above $V_{cc}$, then this excess voltage will not pass through to the other one of the source or drain terminals because the transistor will shut OFF when $V_{gs}$ is less than $V_{tn}$. Accordingly, the inverter I2, which acts as a driver for driving pullup transistor N1 (i.e., generating the input drive signal), can drive the gate 20 to a level substantially equal to $V_{cc}$ to charge bootstrap capacitance $C_{gs}$ and turn ON N1. Any over voltage developed on node 20 caused by the self-bootstrapping effect is not permitted to pass back through transistor N3 to inverter I2. That is, as opposed to conventional circuits where a driver, such as inverter I2, would be directly connected to gate 20 and thus form a short to $V_{cc}$ for overvoltages and negate the desired bootstrapping effect, the present invention eliminates this charge shorting problem. The present invention overcomes this problem by precisely biasing transistor N3 to permit the drive signal to charge $C_{gs}$, while preventing any over-voltage developed on node 20 through the self-bootstrapping effect from being discharged through a driver, such as I2.

Further note that since pass transistor N3 is always ON, the current drawn from the charge pump by way of output rail VP1 is relatively small. That is, the losses associated with dynamically charging and discharging transistor gates between $V_{cc}$ and $V_{ss}$, using the charge pump, are eliminated by the present invention.

With continued reference to FIG. 3, in step 38, transistor P1 operates to trickle a small amount of current to node 20 to replace any charge lost due to leakage via the gate terminal of N1, and via the drain terminal of N3. It should be appreciated that P1 operates when the output is desired to be a logic one or high state. This should be understood from inspection by one of ordinary skill in the art of the biasing of P1 through inverter I4, having due regard for the fact that I4 is shown schematically for purposes of explanation only, as noted above.

Further, during this interval (i.e., when the output is desired to be a logic one) capacitor C1 has accumulated a predetermined charge thereacross, while the capacitance defined by the source-to-gate of transistor N3 has a relatively small charge thereacross (due to the relatively small voltage differential). When the input data signal changes to discontinue the output high on the pad, which causes node 26 to go low, a relatively large voltage differential between nodes 24, and 26 develops. Charge is thus required to accommodate this voltage differential. However, the logic at node 22 changes to a logic one at approximately the same time to reduce the voltage differential across C1, thus requiring a discharge of current therefrom. It should be appreciated that the gate-source capacitance of N3 and C1 share a common terminal, with the second terminals of each being driven by complementary signals. From this observation, it will be apparent that the net voltage change on node 24, due to this equalizing, and offsetting capacitor C1, is fairly negligible. Thus, the conduction state of N3 will not be adversely effected due to changes in the output of I2.

Figure 5:
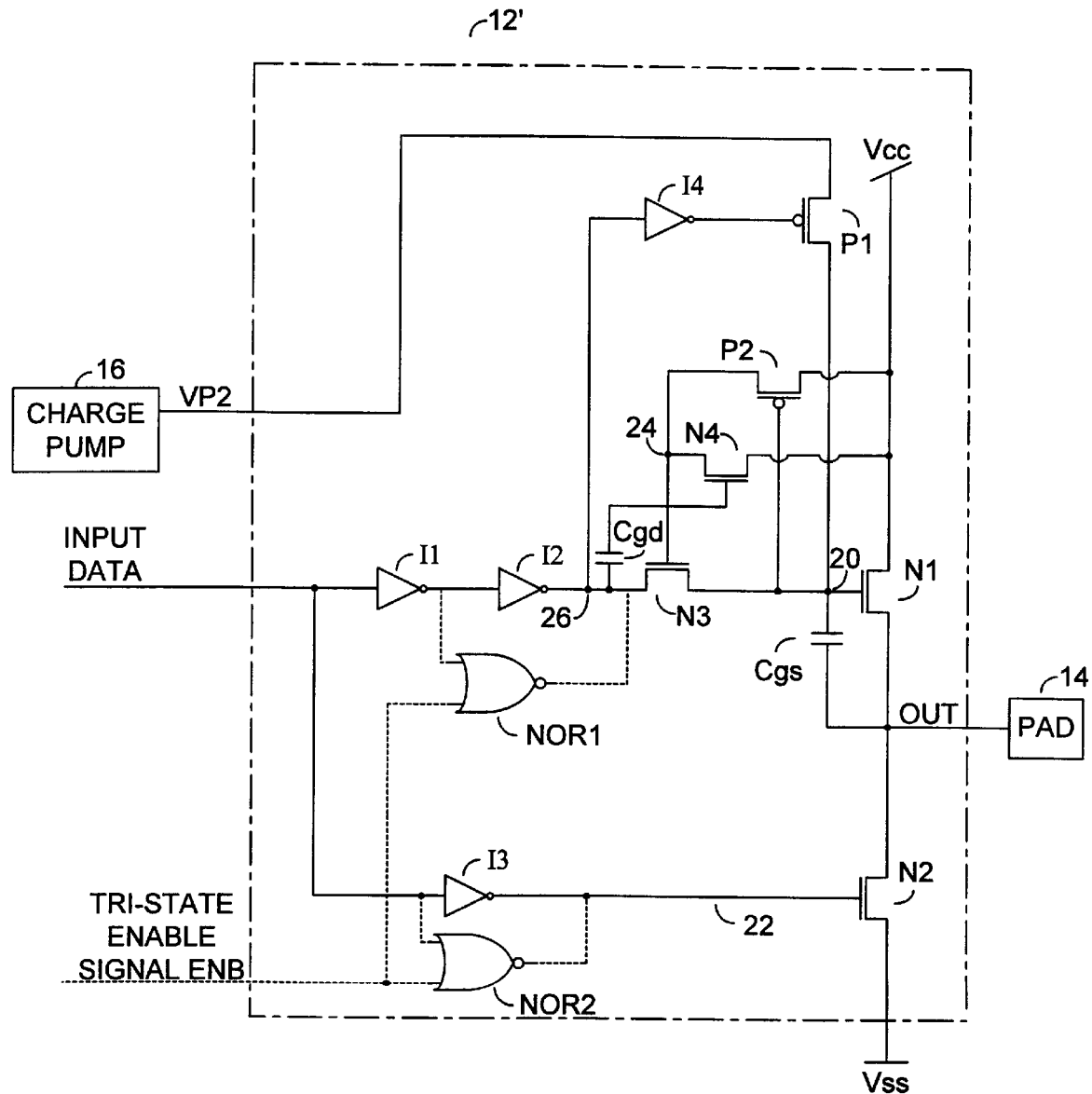
FIG. 5 is a simplified, schematic and block diagram view showing an alternate embodiment according to the present invention.

FIG. 5 shows an alternate, preferred embodiment of an inventive output buffer 12'. Output buffer 12' is similar to output buffer 12 shown in FIG. 2; however, this embodiment includes a different biasing scheme for controlling the gate of isolating transistor N3. In particular, capacitor C1 of output buffer 12 (FIG. 2) has been eliminated, as well as the connection to the charge pump terminal VP1. In substitution thereof, a biasing circuit is provided, and which includes means, such as p-channel transistor P2, for shorting the gate terminal of transistor N3 to the power supply $V_{cc}$, and, diode means, such as diode-connected n-channel transistor N4, for clamping a voltage level on the gate terminal of transistor N3 to a level approximately one device threshold $V_{TH}$ above the power supply $V_{cc}$, and a gate-to-drain capacitance $C_{gd}$ associated with transistor N3.

As discussed above in connection with output buffer 12, when the signal on node 26 rises from $V_{ss}$ to $V_{cc}$, the whole magnitude of the input signal (i.e., $V_{cc}$) must be passed through N3 and onto the gate terminal of transistor N1, hence charging up the soft-bootstrap capacitance $C_{gs}$.

To prevent subsequent charge and voltage loss from node 20 after it has been boosted, the voltage on the gate terminal of transistor N3 must not be permitted to go substantially above about one device threshold $V_{TH}$ greater than $V_{cc}$.

In operation, initially assume that the pull-up transistor N1 is to be off, and that therefore, the gate terminal 20 of transistor N1 is low. This low signal causes transistor P2 to conduct, thus transferring a voltage level of approximately $V_{cc}$ to the gate terminal 24 of pass transistor N3. When the signal on node 26 rises (thus indicating that pull-up transistor N1 is desired to be turned on to thereby pull the output node to a logic high), the gate terminal 24 of transistor N3 will also begin to rise because of the existence of the gate overlap capacitance $C_{gd}$. However, transistor N4 is diode-connected to the power supply $V_{cc}$, and thus will prevent node 24 from going any higher than approximately one device threshold $V_{TH}$ above $V_{cc}$.

If the voltage on node 20 should fall (e.g., when transistor N1 is being turned off), then transistor P2 will be turned on, thereby shorting the gate terminal of transistor N3 (i.e., node 24) to $V_{cc}$.

Therefore, it should be appreciated that the two transistors N4, and P2 replace the capacitor C1 found in the embodiment shown in FIG. 2, as well as its function. It should be noted that the combination of N4, and P2, is more controllable, (and smaller in size) than the capacitor C1 found in the embodiment of FIG. 2.

An output buffer in accordance with the present invention consumes an extremely low amount of power, and further, requires very little power from an on-chip charge pump. Such an embodiment accomplishes this functionality by avoiding using the charge pump to directly drive the gate terminals of dynamically switching transistors.

While the present invention has been particularly shown and described with reference to the preferred embodiments thereof, it is well understood by those skilled in the art that various changes and modifications can be made in the invention without departing from the spirit and scope thereof, the invention being limited only by the appended claims.

I claim:

1. An output buffer responsive to an input signal for generating an output signal on an output node, comprising:

pullup means coupled to a first power supply producing a first voltage level for pulling said output node to a logic high state, said pullup means including means for boosting said input signal which has a magnitude of said first voltage level by a predetermined amount to enable said pullup means to pull said output node to said first voltage level;

means responsive to a second voltage level for passing said input signal to said boosting means and for inhibiting charge associated with said boosting means and which corresponds to voltage levels higher than said first voltage level from leaking to an input signal source; and, capacitance means coupled to said passing and inhibiting means for equalizing induced voltages caused by variations of said input signal.

2. An output buffer responsive to an input signal for generating an output signal on an output node, comprising:

pullup means coupled to a first power supply producing a first voltage level for pulling said output node to a logic high state, said pullup means including means for boosting said input signal which has a magnitude of said first voltage level by a predetermined amount to enable said pullup means to pull said output node to said first voltage level;

means responsive to a second voltage level for passing said input signal to said boosting means and for inhibiting charge associated with said boosting means and which corresponds to voltage levels higher than said first voltage level from leaking to an input signal source; and, means for replacing charge lost by said boosting means due to leakage.

3. The output buffer of claim 1 wherein said pullup means includes a pullup n-channel transistor connected between said first power supply and said output node, said boosting means including a self-bootstrap capacitor associated with said pullup n-channel transistor.

4. The output buffer of claim 1 wherein said passing and inhibiting means includes an n-channel pass transistor connected between said pullup means and said input signal source, said n-channel pass transistor having a gate terminal associated therewith that is biased by said second voltage level when said output node is to be said logic high state.

5. The output buffer of claim 2 wherein said charge replacing means includes a charging p-channel transistor connected between said boosting means and a third power supply producing a third voltage level, said charging p-channel transistor having a gate terminal connected to an inverted version of said input signal, said p-channel transistor being configured to form a resistive path in response to said inverted input signal for replacing charge on said boosting means lost due to leakage.

6. The output buffer of claim 5 wherein said charging p-channel transistor is sized no greater than that required to replace said charge lost due to leakage so as to maintain said pullup means, when active, in a state of conduction sufficient to meet predetermined current sourcing and output voltage levels.

7. An output buffer responsive to an input signal for generating an output signal on an output node comprising:

a pullup n-channel transistor having a drain terminal connected to a first power supply producing a first voltage level, a source terminal connected to said output node, and a gate terminal, said pullup transistor having a bootstrap capacitor associated therewith between said gate terminal and said source terminal, said pullup transistor being configured to pull said output node high to substantially said first voltage level;

a pass n-channel transistor connected between a source of said input signal and said gate terminal of said pullup n-channel transistor, said pass transistor including a gate terminal biased to pass said input signal for charging said bootstrap capacitor while inhibiting charge leakage from said gate terminal of said pullup transistor to said input signal source;

a selected one from the group consisting of a charging p-channel transistor connected between said gate terminal of said n-channel pullup transistor and a second power supply producing a second voltage level greater than said first voltage level for replacing charge on said bootstrap capacitor, a pass transistor biasing circuit for biasing the gate terminal of said pass n-channel transistor, and a capacitor connected coupled to said gate terminal of said pass transistor for equalizing induced voltages caused by variations in said input signal, wherein said gate terminal of said pass transistor is connected to a third power supply producing a third voltage level that is about one device threshold higher than said first voltage level to thereby pass said input signal which has a voltage magnitude of said first voltage level for charging said bootstrap capacitor while inhibiting charge on said bootstrap capacitor which corresponds to voltage levels higher than said first voltage level from leaking to said input signal source.

8. The output buffer of claim 7 wherein said pullup transistor is connected to a positive bus of said first power supply, said buffer further comprising an n-channel pulldown transistor having a drain terminal connected to said output node, and a source terminal connected to a negative bus of said first power supply, said n-channel pulldown transistor being configured to pull said output node low in response to an inverted version of said input signal.

9. An output buffer responsive to an input signal for generating an output signal on an output node. comprising:

a pullup n-channel transistor having a drain terminal connected to a first power supply producing a first voltage level, a source terminal connected to said output node. and a gate terminal, said pullup transistor having a bootstrap capacitor associated therewith between said gate terminal and said source terminal, said pullup transistor being configured to pull said output node high to substantially said first voltage level;

a pass n-channel transistor connected between a source of said input signal and said gate terminal of said pullup n-channel transistor, said pass transistor including a gate terminal biased to pass said input signal for charging said bootstrap capacitor while inhibiting charge leakage from said gate terminal of said pullup transistor to said input signal source; and, a charging p-channel transistor connected between said gate terminal of said n-channel pullup transistor and a second power supply producing a second voltage level greater than said first voltage level for replacing charge on said bootstrap capacitor, said charging p-channel transistor including a gate terminal connected to an inverted version of said input signal to selectively form a resistive path.

10. The output buffer of claim 9 wherein said charging p-channel transistor is sized no greater than that required to replace said charge lost due to leakage so as to maintain said pullup n-channel transistor, when active, in a state of conduction sufficient to meet predetermined current sourcing and output voltage levels.

11. The output buffer of claim 9 wherein said buffer further includes a capacitor, said pullup transistor being connected to a positive bus of said first power supply, said buffer further including a pulldown n-channel transistor having a drain terminal connected to said output node, a source terminal connected to a negative bus of said first power supply, and a gate terminal responsive to an inverted version of said input signal for pulling said output node low to said negative bus, said charging p-channel transistor having a gate terminal connected to an inverted version of said input signal to selectively form a resistive path.

12. A method of operating an output buffer for generating an output signal comprising the steps of:

(A) charging a bootstrap capacitance associated with a pullup transistor by passing an input signal of a first voltage level so that when the pullup transistor conducts and a node voltage level on an output node rises, a gate voltage level on a gate terminal of the pullup transistor is boosted to a second voltage level that is higher than the first voltage level;

(B) inhibiting discharge of the bootstrap capacitance by isolating the bootstrap capacitance from an input signal source such that the pullup transistor is capable of pulling the output node to the first voltage level; and (C) replacing the charge on the bootstrap capacitor as the charge on the bootstrap capacitor is lost due to leakage.

13. The method of claim 13 wherein said charge replacing step is performed when the pullup transistor is to be active.

14. A method of operating an output buffer for generating an output signal, comprising the steps of:

(A) charging a bootstrap capacitance associated with a pullup transistor by passing an input signal of a first voltage level so that when the pullup transistor conducts and a node voltage level on an output node rises, a gate voltage level on a gate terminal of the pullup transistor is boosted to a second voltage level that is higher than the first voltage level;

(B) inhibiting discharge of the bootstrap capacitance by isolating the bootstrap capacitance from an input signal source such that the pullup transistor is capable of pulling the output node to the first voltage level, and biasing a pass n-channel transistor disposed between the input signal source and the gate terminal of the pullup transistor at a level about one device threshold higher than the first voltage level.

15. The method of claim 14 further including the step of:

equalizing and offsetting a coupling voltage induced by variations in the input signal on the pass transistor using a capacitor.

16. The output buffer of claim 2 wherein said pullup means includes a pullup n-channel transistor connected between said first power supply and said output node, said boosting means including a self-bootstrap capacitor associated with said pullup n-channel transistor.

17. The output buffer of claim 2 wherein said passing and inhibiting means includes an n-channel pass transistor connected between said pullup means and said input signal source, said n-channel pass transistor having a gate terminal associated therewith that is biased by said second voltage level when said output node is to be said logic high state.

18. The method of claim 12 further including the step of:

equalizing and offsetting a coupling voltage induced by variations in the input signal on the pass transistor using a capacitor.

19. The method of claim 14 further including the step of:

replacing the charge on the bootstrap capacitor as the charge on the bootstrap capacitor is lost due to leakage.

20. The output buffer of claim 9 wherein said pullup transistor is connected to a positive bus of said first power supply, said buffer comprising an n-channel pulldown transistor having a drain terminal connected to said output node, and a source terminal connected to a negative bus of said first power supply, said n-channel pulldown transistor being configured to pull said output node low in response to an inverted version of said input signal.

21. The output buffer of claim 7 wherein said buffer further includes a capacitor, said pullup transistor being connected to a positive bus of said first power supply, said buffer further including a pulldown n-channel transistor having a drain terminal connected to said output node, a source terminal connected to a negative bus of said first power supply, and a gate terminal responsive to an inverted version of said input signal for pulling said output node low to said negative bus, said charging p-channel transistor having a gate terminal connected to an inverted version of said input signal to selectively form a resistive path.

* * * * *